United States Patent
Honma et al.

(10) Patent No.: US 10,293,543 B2
(45) Date of Patent: May 21, 2019

(54) METHOD OF PRODUCING A PATTERNED FILM

(71) Applicant: CANON KABUSHIKI KAISHA, Tokyo (JP)

(72) Inventors: Takeshi Honma, Tokyo (JP); Toshiki Ito, Kawasaki (JP); Shiori Yonezawa, Tokyo (JP); Keiko Chiba, Utsunomiya (JP); Keiji Yamashita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 364 days.

(21) Appl. No.: 14/900,116

(22) PCT Filed: Jun. 19, 2014

(86) PCT No.: PCT/JP2014/003311
§ 371 (c)(1),
(2) Date: Dec. 18, 2015

(87) PCT Pub. No.: WO2014/208064
PCT Pub. Date: Dec. 31, 2014

(65) Prior Publication Data
US 2016/0144555 A1   May 26, 2016

(30) Foreign Application Priority Data

Jun. 26, 2013  (JP) .................. 2013-133538
Nov. 29, 2013  (JP) .................. 2013-247135
May 27, 2014  (JP) .................. 2014-109339

(51) Int. Cl.
*B29C 59/02*     (2006.01)
*C08F 2/44*      (2006.01)
(Continued)

(52) U.S. Cl.
CPC ............ *B29C 59/026* (2013.01); *B29C 33/62* (2013.01); *B29C 59/002* (2013.01);
(Continued)

(58) Field of Classification Search
CPC ... B29D 11/00; C08F 2/46; C08F 2/48; C08F 2/44; C08F 2/50; C08F 220/18;
(Continued)

(56) References Cited

U.S. PATENT DOCUMENTS

2004/0059013 A1   3/2004   Tanabe
2008/0131791 A1   6/2008   Cho et al.
(Continued)

FOREIGN PATENT DOCUMENTS

CN    1208056 A    2/1999
CN    105009256 A   10/2015
(Continued)

OTHER PUBLICATIONS

Qing Wang, et al., "Effects of Environmental Gas in UV Nanoimprint on the Characteristics of UV-Curable Resin", Japanese Journal of Applied Physics, vol. 49, 2010, pp. 06GL04 1-4.
(Continued)

*Primary Examiner* — Carl J Arbes
(74) *Attorney, Agent, or Firm* — Canon U.S.A., Inc. IP Division

(57) ABSTRACT

In an imprint method in a condensable gas atmosphere, the force (mold releasing force) required to separate a mold from a resist cured film (mold release) has been large. A photocurable composition for performing imprint in an atmosphere containing a condensable gas includes a component (A) which is a (meth)acrylate monomer; a component (B) which is a photopolymerization initiator; and a component (C) which is a mold releasing agent. The saturated solubility of the component (C) in the condensable gas at 5 degrees (Celsius) and 1 atm is 50% by weight or more, the condensable gas being in a liquid state at 5 degrees (Celsius) and 1 atm.

6 Claims, 2 Drawing Sheets

(51) Int. Cl.
  *C08F 2/50* (2006.01)
  *C08F 220/18* (2006.01)
  *G03F 7/00* (2006.01)
  *H01L 21/027* (2006.01)
  *H01L 21/266* (2006.01)
  *B29C 59/00* (2006.01)
  *C08L 33/08* (2006.01)
  *B29C 33/62* (2006.01)
  *C08F 222/10* (2006.01)
  *B29K 33/00* (2006.01)
  *B29K 105/00* (2006.01)

(52) U.S. Cl.
  CPC .............. *B29C 59/005* (2013.01); *C08F 2/44* (2013.01); *C08F 2/50* (2013.01); *C08F 220/18* (2013.01); *C08L 33/08* (2013.01); *G03F 7/0002* (2013.01); *H01L 21/0271* (2013.01); *H01L 21/266* (2013.01); *B29K 2033/08* (2013.01); *B29K 2105/0005* (2013.01); *C08F 222/1006* (2013.01); *C08K 2201/00* (2013.01)

(58) Field of Classification Search
  CPC . H01L 21/0271; H01L 21/0273; B29C 33/62; B29C 59/002; B29C 59/005; B29C 59/026; B29K 2033/08; B29K 2105/0005; G03F 7/0002; G08F 222/1006; C08K 2201/00; C08L 33/08
  See application file for complete search history.

(56) References Cited

U.S. PATENT DOCUMENTS

| | | |
|---|---|---|
| 2009/0115110 A1 | 5/2009 | Schumaker |
| 2010/0123886 A1 | 5/2010 | Bijnen et al. |
| 2012/0199997 A1 | 8/2012 | Tanabe |
| 2012/0306122 A1 | 12/2012 | Hoshino |
| 2013/0032971 A1 | 2/2013 | Omatsu et al. |
| 2013/0052431 A1 | 2/2013 | Enomoto |
| 2013/0099423 A1 | 4/2013 | Umekawa |
| 2014/0239529 A1 | 8/2014 | Tan et al. |
| 2014/0349086 A1 | 11/2014 | Ito et al. |

FOREIGN PATENT DOCUMENTS

| | | | |
|---|---|---|---|
| JP | 01-229024 | * | 9/1989 |
| JP | 3700001 B2 | | 9/2005 |
| JP | 2007-144995 A | | 6/2007 |
| JP | 2011096766 A | | 5/2011 |
| JP | 2011171364 A | | 9/2011 |
| JP | 2012-109551 A | | 6/2012 |
| JP | 2012164785 A | | 8/2012 |
| JP | 2013070033 A | | 4/2013 |
| JP | 2013168645 A | | 8/2013 |
| JP | 2014033082 A | | 2/2014 |
| KR | 10-2009-0027169 | * | 3/2009 |
| KR | 10-2012-0034105 A | | 4/2012 |
| WO | 2013/008940 A1 | | 1/2013 |
| WO | 2013035761 A1 | | 3/2013 |
| WO | 2013/069511 A1 | | 5/2013 |
| WO | 2014/046304 A1 | * | 3/2014 |
| WO | 2014/084395 A1 | | 6/2014 |

OTHER PUBLICATIONS

Shu Kaneko, et al., "Morphological Changes in Ultraviolet-Nanoimprinted Resin Patterns Caused by Ultraviolet-Curable Resins Absorbing Pentafluoropropane", Japanese Journal of Applied Physics, vol. 51, 2012, pp. 06FJ05 1-6.

U.S. Appl. No. 14/900,126, filed Dec. 18, 2015, Toshiki Ito.

U.S. Appl. No. 14/900,593, filed Dec. 21, 2015, Shiori Yonezawa.

Youn et al., "Control of Resin Filling and Pattern Quality of Ultraviolet Nanoimprint Lithography in Pentafluoropropane and HeliumAmbient", Journal of Applied Physics 52 (2013) 06GJ07 (Year: 2013).

Hiroshi Hiroshima, "Quick Cavity Filling in UV Nanoimprint Using Pentafluoropropane", Japanese Journal of Applied Physics, 2008, pp. 5151-5155, vol. 47, No. 6.

* cited by examiner

[Fig. 1A]
[Fig. 1B]
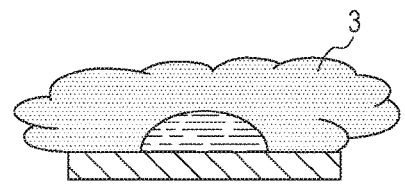
[Fig. 1C-1]
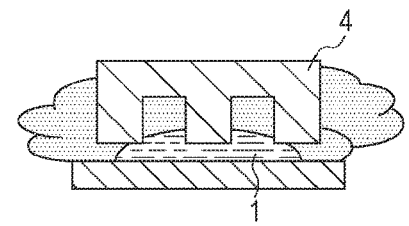
[Fig. 1C-2]
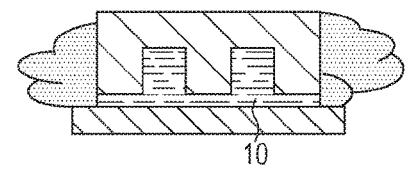
[Fig. 1D]
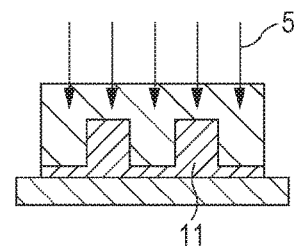
[Fig. 1E]
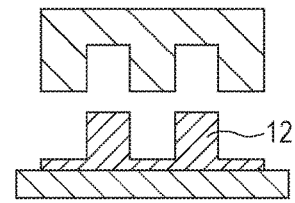

[Fig. 1F]
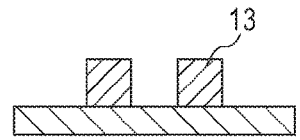
[Fig. 1G]
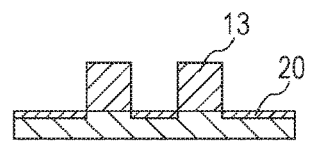
[Fig. 2A]
[Fig. 2B]
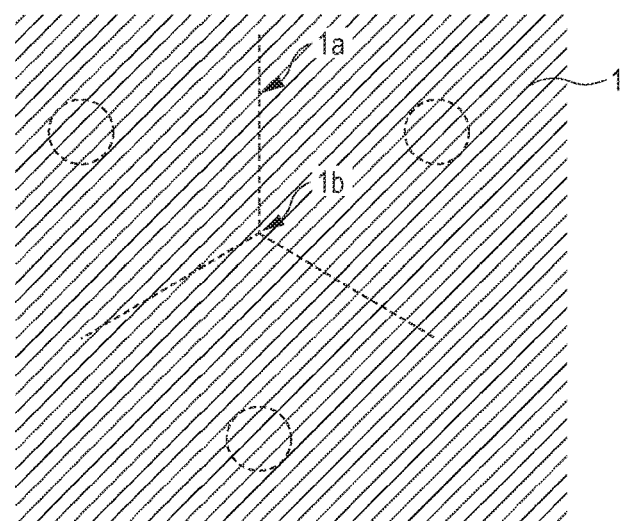

US 10,293,543 B2

METHOD OF PRODUCING A PATTERNED FILM

TECHNICAL FIELD

The present invention relates to a photocurable composition, methods for producing a film, an optical component, a circuit board, and an electronic component by using the photocurable composition, and a cured product.

BACKGROUND ART

Advances in miniaturization of semiconductor devices and micro electro mechanical systems (MEMS) have increased the focus on a combination of existing photolithography and nanofabrication technology called photo imprint technology in which a resist (photocurable composition) on a wafer is shaped with a mold to form a resist pattern on the substrate. According to this technology, sub-ten-nanometer-scale fine structures can be formed on a substrate. In a photo imprint system, a resist is first applied to a pattern-forming region on a substrate and then shaped using a mold on which a pattern has been preliminarily formed. The resist is then irradiated with light to be cured and the cured product is separated from the mold. As a result, a resin pattern (photocured product) is obtained on the substrate.

In forming the resin pattern (photocured product), the thickness of the residual film of the resin pattern (photocured product) is desirably uniform across the surface of the substrate. This is to eliminate in-plane variation of line width that may result from, for example, a dry etching treatment in an etching step, which is a step other than the pattern-forming step by an imprint system in the semiconductor device fabrication process. United States Laid-open Patent Application No. 2009/0115110 teaches an imprint method of making uniform the residual film thickness of the resin pattern (photocured product). According to this imprint method, a resist is applied onto a substrate by an ink jet method and the arrangement of resist droplets is optimized in accordance with the density of the pattern to be transferred. However, according to this imprint method of arranging resist droplets in a discrete manner on a substrate, the resist droplets do not spread easily on the substrate and thus when a pattern portion formed in the mold is pressed against the resist on the substrate, bubbles tend to remain between the pattern portion and the resist. The bubbles may remain in the cured resist and the resin pattern (photocured product) may come to have an unintended shape due to the bubbles. Alternatively, a standby time may be required until the remaining bubbles disappear but this decreases productivity.

Japanese Patent No. 3700001 teaches a method for rapidly clearing the remaining bubbles. According to this method, a condensable gas that becomes condensed by capillary action generated as the resist penetrates the gaps between the substrate and the mold and recesses on the mold is introduced between the space between the mold and the substrate so that the condensable gas becomes condensed, resulting in volume reduction. The condensable gas employed in Japanese Patent No. 3700001 is trichlorofluoromethane ($CFCl_3$). Japanese Journal of Applied Physics, Vol. 47, No. 6, 2008, pp. 5151-5155 teaches that a filling property can be improved by employing 1,1,1,3,3-pentafluoropropane ($CHF_2CH_2CF_3$) as the condensable gas.

However, even in such processes that use condensable gases, the force (mold releasing force) required to separate (release) the mold from the resist cured film has been large.

CITATION LIST

Patent Literature

PTL 1: United States Patent Laid-Open No. 2009/0115110
PTL 2: Japanese Patent No. 3700001

Non Patent Literature

NPL 1: Japanese Journal of Applied Physics, Vol. 47, No. 6, 2008, pp. 5151-5155

SUMMARY OF INVENTION

Solution to Problem

An aspect of the invention provides a photocurable composition for performing imprint in an atmosphere containing a condensable gas, the photocurable composition including at least a component (A) which is a (meth)acrylate monomer; a component (B) which is a photopolymerization initiator; and a component (C) which is a mold releasing agent. The saturated solubility of the component (C) in the condensable gas at 5 degrees (Celsius) and 1 atm is 50% by weight or more, the condensable gas being in a liquid state at 5 degrees (Celsius) and 1 atm.

According to the present invention, a cured film having small mold releasing force, an optical component, a circuit board, an electronic component, and a cured product can be obtained by performing imprint in a condensable gas atmosphere.

Further features of the present invention will become apparent from the following description of exemplary embodiments with reference to the attached drawings.

BRIEF DESCRIPTION OF DRAWINGS

FIG. 1A is a cross-sectional view of a step in methods for producing a film, an optical component, a circuit board, and an electronic component.

FIG. 1B is a cross-sectional view of another step in the methods for producing a film, an optical component, a circuit board, and an electronic component.

FIG. 1C-1 is a cross-sectional view of another step in the methods for producing a film, an optical component, a circuit board, and an electronic component.

FIG. 1C-2 is a cross-sectional view of another step in the methods for producing a film, an optical component, a circuit board, and an electronic component.

FIG. 1D is a cross-sectional view of another step in the methods for producing a film, an optical component, a circuit board, and an electronic component.

FIG. 1E is a cross-sectional view of another step in the methods for producing a film, an optical component, a circuit board, and an electronic component.

FIG. 1F is a cross-sectional view of another step in the methods for producing a film, an optical component, a circuit board, and an electronic component.

FIG. 1G is a cross-sectional view of another step in the methods for producing a film, an optical component, a circuit board, and an electronic component.

FIG. 2A is a plan view of a photocurable composition of an embodiment placed on portions spaced from one another.

FIG. 2B is another plan view of the photocurable composition placed on portions spaced from one another.

DESCRIPTION OF EMBODIMENTS

The embodiments of the present invention will now be described in detail. The scope of the invention is not limited to the embodiments described below and modifications, alterations, improvements, etc., can be effected on the embodiments based on the common knowledge of persons skilled in the art without departing from the scope of the invention.

A photocurable composition according to one embodiment is used for performing imprint in an atmosphere containing a condensable (hereinafter this atmosphere may be referred to as "condensable gas atmosphere") and includes at least the following components (A), (B), and (C):
(A) a (meth)acryl monomer
(B) a photopolymerization initiator
(C) a mold releasing agent The saturated solubility of the component (C) in the condensable gas in a liquid state is 50% by weight or more at 5 degrees (Celsius) and 1 atm.

The respective components will now be described in detail.

Component (A): (Meth)Acryl Monomer

The component (A) is a (meth)acryl monomer. The (meth)acryl monomer serving as the component (A) reacts with a polymerization factor (such as a radical) generated from a photopolymerization initiator (component (B)) and forms a polymer compound film as a result of chain reaction (polymerization reaction).

The component (A) may be constituted by just one (meth)acryl monomer or by a plurality of (meth)acryl monomers. In the case where a plurality of (meth)acryl monomers constitute the component (A), a monofunctional (meth)acryl monomer and a polyfunctional (meth)acryl monomer are preferably contained. This is because a cured film having high strength can be obtained from a combination of a monofunctional (meth)acryl monomer and a polyfunctional (meth)acryl monomer.

The term "(meth)acryl monomer" refers to a compound (monomer) that includes one or more acryloyl groups or methacryloyl groups.

A (meth)acryl monomer in which a condensable gas exhibits a saturated solubility of 30% by weight or less at 23 degrees (Celsius) which is near room temperature may be used as the component (A). This is presumably because use of a (meth)acryl monomer in which the saturated solubility of a condensable gas is low causes a larger quantity of the condensable gas to concentrate on a mold releasing layer formed of the component (C). The saturated solubility of the condensable gas described here is a percentage obtained by dividing the increase in weight occurred by bubbling a condensable gas for 15 minutes into 3 g of a target solution in which the condensable gas is to be dissolved at 23 degrees (Celsius), 1 atm, and a condensable gas flow rate of 0.1 L/min by the weight 3 g of the target solution before the bubbling.

In the case where only one (meth)acryl monomer is used as the component (A), a (meth)acryl monomer in which the condensable gas exhibits a saturated solubility of 30% by weight or less at 23 degrees (Celsius) may be used.

In the case where a plurality of (meth)acryl monomers are used in combination as the component (A), a combination of (meth)acryl monomers in which the condensable gas exhibits a saturated solubility of 30% by weight or less at 23 degrees (Celsius) may be used.

Specific examples of the component (A) include, but are not limited to, isobornyl(meth)acrylate, dicyclopentenyl (meth)acrylate, dicyclopentanyl(meth)acrylate, dicyclopentenyloxyethyl(meth)acrylate, pentamethylpiperidinyl methacrylate, tetramethylpiperidinyl methacrylate, tetrahydrofurfuryl(meth)acrylate, benzyl(meth)acrylate, phenoxyethyl(meth)acrylate, phenoxypolyethylene glycol acrylate, n-vinylpyrrolidone, 1-adamantyl(meth)acrylate, 2-methyl-2-adamantyl(meth)acrylate, 2-ethyl-2-adamantyl (meth)acrylate, 3-hydroxy-1-adamantyl(meth)acrylate, dimethylol tricyclodecane di(meth)acrylate, 1,3-adamantane dimethanol di(meth)acrylate, 1,3-adamantane diol di(meth) acrylate, decalin dimethanol di(meth)acrylate, 1,9-nonanediol(meth)acrylate, 1,10-decanediol acrylate, dodecyl(meth) acrylate, isododecyl(meth)acrylate, octadecyl(meth) acrylate, isooctadecyl(meth)acrylate, 2-hydroxyethyl(meth) acrylate, and any combination of these.

The examples of the component (A) given above are particularly preferable when the condensable gas is 1,1,1,3,3-pentafluoropropane ($CHF_2CH_2CF_3$, may also be described as HFC-245fa and may be referred to as PFP hereinafter). This is because these compounds are (meth) acryl monomers in which the saturated solubility of 1,1,1,3,3-pentafluoropropane at 23 degrees (Celsius) is low. Moreover, when the condensable gas is 1,1,1,3,3-pentafluoropropane, a mixture of isobornyl acrylate and 1,10-decanediol diacrylate is most preferable as the component (A) among these examples.

Other specific examples of the component (A) include monofunctional (meth)acryl compounds having one acryloyl group or methacryloyl group, such as phenoxy-2-methylethyl(meth)acrylate, phenoxyethoxyethyl(meth)acrylate, 3-phenoxy-2-hydroxypropyl(meth)acrylate, 2-phenylphenoxyethyl(meth)acrylate, 4-phenylphenoxyethyl(meth)acrylate, 3-(2-phenylphenyl)-2-hydroxypropyl (meth)acrylate, a (meth)acrylate of EO-modified p-cumylphenol, 2-bromophenoxyethyl(meth)acrylate, 2,4-dibromophenoxyethyl(meth)acrylate, 2,4,6-tribromophenoxyethyl(meth)acrylate, EO-modified phenoxy(meth)acrylate, PO-modified phenoxy(meth)acrylate, polyoxyethylene nonyl phenyl ether(meth)acrylate, bornyl(meth)acrylate, tricyclodecanyl(meth)acrylate, cyclohexyl(meth)acrylate, 4-butylcyclohexyl(meth)acrylate, acryloylmorpholine, 2-hydroxypropyl(meth)acrylate, 2-hydroxybutyl(meth)acrylate, methyl(meth)acrylate, ethyl (meth)acrylate, propyl(meth)acrylate, isopropyl(meth)acrylate, butyl(meth)acrylate, amyl(meth)acrylate, isobutyl (meth)acrylate, t-butyl(meth)acrylate, pentyl(meth)acrylate, isoamyl(meth)acrylate, hexyl(meth)acrylate, heptyl(meth) acrylate, octyl(meth)acrylate, isooctyl(meth)acrylate, 2-ethylhexyl(meth)acrylate, nonyl(meth)acrylate, decyl(meth) acrylate, isodecyl(meth)acrylate, undecyl(meth)acrylate, lauryl(meth)acrylate, stearyl(meth)acrylate, isostearyl (meth)acrylate, butoxyethyl(meth)acrylate, ethoxy diethylene glycol(meth)acrylate, polyethylene glycol mono(meth) acrylate, polypropylene glycol mono(meth)acrylate, methoxyethylene glycol(meth)acrylate, ethoxyethyl(meth) acrylate, methoxy polyethylene glycol(meth)acrylate, methoxy polypropylene glycol(meth)acrylate, diacetone (meth)acrylamide, isobutoxy methyl(meth)acrylamide, N,N-dimethyl(meth)acrylamide, t-octyl(meth)acrylamide, dimethylaminoethyl(meth)acrylate, diethylaminoethyl (meth)acrylate, 7-amino-3,7-dimethyloctyl(meth)acrylate, N,N-diethyl(meth)acrylamide, and N,N-dimethylaminopropyl(meth)acrylamide.

Examples of the commercially available products of such monofunctional (meth)acryl compounds include ARONIX M101, M102, M110, M111, M113, M117, M5700, TO-1317, M120, M150, and M156 (products of TOAGOSEI CO., LTD.), MEDOL10, MIBDOL10, CHDOL10, MMDOL30, MEDOL30, MIBDOL30, CHDOL30, LA, IBXA, 2-MTA, HPA. Viscoat #150, #155, #158, #190, #192, #193, #220, #2000, #2100, and #2150 (products of Osaka Organic Chemical Industry Ltd.), LIGHT ACRYLATE BO-A, EC-A, DMP-A, THF-A, HOP-A, HOA-MPE, HOA-MPL, PO-A, P-200A, NP-4EA, and NP-8EA, and EPOXY ESTER M-600A (products of Kyoeisha Chemical Co., ltd.), KAYARAD TC110S, R-564, and R-128H (products of NIPPON KAYAKU Co., Ltd.), NK ESTER AMP-10G and AMP-20G (products of Shin-Nakamura Chemical Co., Ltd.), FA-511A, 512A, and 513A (products of Hitachi Chemical Co., Ltd.), PHE, CEA, PHE-2, PHE-4, BR-31, BR-31M, and BR-32 (products of Dai-Ichi Kogyo Seiyaku Co. Ltd.), VP (product of BASF), and ACMO, DMAA, and DMAPAA (products of KOHJIN Holdings Co., Ltd.).

Other specific examples of the component (A) include polyfunctional (meth)acryl compounds having two or more acryloyl groups or methacryloyl groups, such as trimethylolpropane di(meth)acrylate, trimethylolpropane tri(meth)acrylate, EO-modified trimethylolpropane tri(meth)acrylate, PO-modified trimethylolpropane tri(meth)acrylate, EO-, PO-modified trimethylolpropane tri(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, tris(2-hydroxyethyl) isocyanurate tri(meth)acrylate, tris(acryloyloxy) isocyanurate, bis (hydroxymethyl)tricyclodecane di(meth)acrylate, dipentaerythritol penta(meth)acrylate, dipentaerythritol hexa(meth)acrylate, EO-modified 2,2-bis(4-((meth)acryloxy) phenyl)propane. PO-modified 2,2-bis(4-((meth)acryloxy) phenyl)propane, and EO-, PO-modified 2,2-bis(4-((meth) acryloxy)phenyl)propane.

Examples of the commercially available products of these polyfunctional (meth)acryl compounds include YUPIMER UV SA1002 and SA2007 (products of Mitsubishi Chemical Corporation), Viscoat #195, #230, #215, #260, #335HP, #295, #300, #360. #700, GPT, and 3PA (products of Osaka Organic Chemical Industry Ltd.), LIGHT ACRYLATE 4EG-A, 9EG-A, NP-A, DCP-A, BP-4EA, BP-4PA, TMP-A, PE-3A, PE-4A, and DPE-6A (products of Kyoeisha Chemical Co., Ltd.), KAYARAD PET-30, TMPTA, R-604, DPHA, DPCA-20, -30, -60, -120, HX-620, D-310, and D-330 (products of NIPPON KAYAKU Co., Ltd.), ARONIX M208, M210, M215, M220, M240, M305, M309, M310, M315, M325, and M400 (products of Toagosei Co., Ltd.), and Ripoxy VR-77, VR-60, and VR-90 (products of Showa Denko Co., Ltd.).

In the groups of the compounds described above, "(meth) acrylate" means an acrylate and a corresponding methacrylate. A "(meth)acryloyl group" refers to an acryloyl group and a corresponding methacryloyl group. EO represents ethylene oxide and an "EO-modified compound" refers to a compound that has a block structure of an ethylene oxide group. PO represents propylene oxide and a "PO-modified compound" refers to a compound having a block structure of a propylene oxide group.

Component (B): Photopolymerization Initiator

The component (B) is a photopolymerization initiator.

For the purposes of the present invention and the specification, a photopolymerization initiator is defined as a compound that generates a polymerization factor (radical) upon sensing light of a particular wavelength. More specifically, a photopolymerization initiator is a polymerization initiator (radical generator) that generates a radical in response to light (infrared rays, visible rays, ultraviolet rays, far ultraviolet rays, X-rays, charged particle beams such as electron beams, and radiations).

The photopolymerization initiator serving as the component (B) may be constituted by one photopolymerization initiator or plural photopolymerization initiators.

Examples of the radical generator include substituted or unsubstituted 2,4,5-triaryl imidazole dimers such as a 2-(o-chlorophenyl)-4,5-diphenyl imidazole dimer, a 2-(o-chlorophenyl)-4,5-di(methoxyphenyl) imidazole dimer, a 2-(o-fluorophenyl)-4,5-diphenyl imidazole dimer, and a 2-(o- or p-methoxyphenyl)-4,5-diphenyl imidazole dimer; benzophenone derivatives such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; aromatic ketone derivatives such as 2-benzyl-2-dimethylamino-1-(4-morpholinophenyl)-butanone-1,2-methyl-1-[4-(methylthio)phenyl]-2-morpholiono-propanone-1-on; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methyl benzoin, ethyl benzoin, and propyl benzoin; benzyl derivatives such as benzyl dimethyl ketal; acridine derivatives such as 9-phenylacridine and 1,7-bis(9,9'-acridinyl)heptane; N-phenyl glycine derivatives such as N-phenyl glycine; acetophenone derivatives such as acetophenone, 3-methylacetophenone, acetophenone benzyl ketal, 1-hydroxycyclohexyl phenyl ketone, and 2,2-dimethoxy-2-phenyl acetophenone; thioxanthone derivatives such as thioxanthone, diethylthioxanthone, 2-isopropylthioxanthone, and 2-chlorothioxanthone; xanthone, fluorenone, benzaldehyde, fluorene, anthraquinone, triphenylamine, carbazole, 1-(4-isopropylphenyl)-2-hydroxy-2-methylpropan-1-one, 2-hydroxy-2-methyl-1-phenylpropan-1-one, 2,4,6-trimethylbenzoyldiphenylphosphine oxide, bis-(2,6-dimethoxybenzoyl)-2,4,4-trimethylpentylphosphine oxide, 1,2-octanedione, 1-[4-(phenylthio)-,2-(O-benzoyloxime)], and ethanone, 1-[9-ethyl-6-(2-methylbenzoyl)-9H-carbazol-3-yl]-,1-(0-acetyloxime).

Examples of the commercially available products of these radical generators include Irgacure 184, 369, 651, 500, 819, 907, 784, 2959, CGI-1700, -1750, -1850, and CG24-61, Darocur 1116 and 1173, and Lucirin TPO, LR8893, and LR8970 (products of BASF), and EBECRYL P36 (product of UCB).

The component (B) is preferably an alkyl phenone-based polymerization initiator, an acyl phosphine oxide-based polymerization initiator, or an oxime ester-based polymerization initiator among these examples.

Among the compounds listed above as examples, benzoin ether derivatives such as benzoin methyl ether, benzoin ethyl ether, and benzoin phenyl ether, benzoin derivatives such as benzoin, methyl benzoin, ethyl benzoin, and propyl benzoin, benzyl derivatives such as benzyl dimethyl ketal, and acetophenone derivatives such as acetophenone, 3-methylacetophenone, acetophenone benzyl ketal, 1-hydroxycyclohexyl phenyl ketone, and 2,2-dimethoxy-2-phenylacetophenone are the alkyl phenone-based polymerization initiators.

A more specific example of the alkyl phenone-based polymerization initiator is (2-benzyl-2-dimethylamino-1-(4-morpholinophenyl)-butanone-1) represented by formula (1) below.

[Chem. 1]

Formula (1)

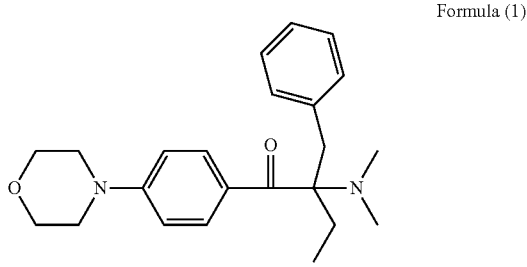

The polymerization initiator represented by formula (1) is a highly sensitive polymerization initiator and a curability of a photocurable composition prepared by using this polymerization initiator exhibits good curing properties.

Among the compounds listed as examples above, 2,4,6-trimethylbenzoyldiphenylphosphine oxide, bis(2,4,6-trimethylbenzoyl)phenylphosphine oxide, and bis(2,6-dimethoxybenzoyl)-2,4,4-trimethylpentylphosphine oxide are the acyl phosphine oxide-based polymerization initiators. A more preferable example of the acylphosphine oxide-based polymerization initiator is 2,4,6-trimethylbenzoyldiphenylphosphine oxide represented by formula (2) below:

[Chem. 2]

Formula (2)

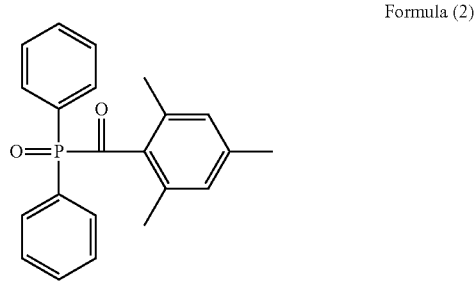

Among the compounds listed as examples above, 1,2-octanedione, 1-[4-(phenylthio)-,2-(O-benzoyloxime)] and ethanone, 1-[9-ethyl-6-(2-methylbenzoyl)-9H-carbazol-3-yl]-,1-(0-acetyloxime) are the oxime ester-based polymerization initiators.

The blend ratio of the polymerization initiator serving as the component (B) in the photocurable composition is 0.01% by weight or more and 10% by weight or less and preferably 0.1% by weight or more and 7% by weight or less relative to the total amount of the component (A).

The curing rate is increased when 0.01% by weight or more of the polymerization initiator is contained relative to the total amount of the component (A). Favorable mechanical properties can be imparted to a cured product of a photocurable composition when the blend ratio of the polymerization initiator relative to the total amount of the component (A) is 10% by weight or less.

Component (C): Mold Releasing Agent

The component (C) is a mold releasing agent.

A mold releasing agent is a compound that is contained in a photocurable composition and decreases the mold releasing force of the cured product prepared by curing the photocurable composition. In other words, the force (mold releasing force) needed to release a cured product composed of a photocurable composition containing a mold releasing agent from a mold is smaller than the force (mold releasing force) needed to release a cured product composed of a photocurable composition not containing a mold releasing agent from the mold. A mold releasing agent tends to segregate at the interface between the photocurable composition and the mold.

Examples of the mold releasing agent include a surfactant having a portion having high affinity to the component (A) and a portion having low affinity to the component (A) and a material that has a portion that can readily adsorb onto a mold. A "portion having high affinity to the component (A)" is a portion that is highly miscible with the component (A) and exhibits highly polarity by containing a polarization-inducing atom such as an oxygen atom, a nitrogen atom, or a sulfur atom.

Examples of such a portion include an oxyethylene group, an oxypropylene group, a repeating structure of an oxyethylene group, a repeating structure of an oxypropylene group, a repeating structure of an oxyethylene group, and a repeating structure of an oxypropylene group.

A "portion having low affinity to the component (A)" is a portion that is sparingly miscible with the component (A) and exhibits low polarity since no atoms that can induce polarization, such as an oxygen atom, a nitrogen atom, and a sulfur atom, are contained. Examples of such a portion include groups constituted by fluorine atoms and carbon atoms and groups constituted by fluorine atoms, carbon atoms, and hydrogen atoms. To be more specific, the portion may be an alkyl group or an alkyl group having hydrogen substituted with fluorine (fluorinated alkyl group).

When the portion having high affinity to the component (A) is constituted by two or more groups, each of the groups may have high affinity to the component (A). When the portion having low affinity to the component (A) is constituted by two or more groups, each of the groups may have low affinity to the component (A).

Examples of the portion that can readily adsorb onto a mold composed of quartz are polar functional groups that interact (for example, hydrogen-bond) with the quartz surface. Examples of such a group include a hydroxyl group, a carboxyl group, a sulfo group, an alkoxy group, a pyridyl group, and a silanol group.

The component (C) serving as the mold releasing agent tends to segregate at the interface between the photocurable composition and the mold. This means that the concentration of component (C) (the mold releasing agent) at the interface between the photocurable composition and the mold tends to be higher than the concentrations in other portions of the photocurable composition.

The saturated solubility of the component (C) in a condensable gas in a liquid state at 5 degrees (Celsius) and 1 atom is 50% by weight or more, preferably 60% by weight or more, and most preferably 80% by weight or more.

When the saturated solubility of the component (C) in a condensable gas in a liquid state at 5 degrees (Celsius) and 1 atom is 50% by weight or more, the force needed to separate the mold from a cured film is decreased during the imprint process performed in a condensable gas atmosphere described below.

The reason for this is presumably as follows.

In a mold contact step [2] of the process of forming a patterned film by using the photocurable composition of this embodiment described below, the component (C) segregates at the interface between the photocurable composition and the mold and a mold releasing agent layer is formed as a result. During this process, the condensable gas becomes condensed by capillary action that occurs as the photocurable composition contacts the mold and the condensable gas penetrates the gap between the substrate and the mold and recesses on the mold. As a result, the condensable gas liquefies and dissolves in the photocurable composition.

When the component (C) has a saturated solubility of 50% by weight or more in the condensable gas in a liquid state at 5 degrees (Celsius) and 1 atm, the condensable gas concentrates at the mold releasing agent layer having high affinity to the condensable gas. In other words, dissolved condensable gas concentrates at the interface between the photocurable composition and the mold. As a result, direct contact between the photocurable composition and the mold can be avoided and the mold releasing force required to separate the mold is decreased.

From this viewpoint, the saturated solubility of the component (C) in a condensable gas in a liquid state at 5 degrees (Celsius) and 1 atm is preferably higher than the saturated solubility of the component (A) in a condensable gas in a liquid state at 5 degrees (Celsius) and 1 atm since concentration of the condensable gas proceeds smoothly.

The component (C) may be constituted by one mold releasing agent or two or more mold releasing agents.

The blend ratio of the component (C) (in other words, the abundance of the component (C) in a photocurable composition when the total weight of the photocurable composition is assumed to be 1) relative to the total weight of the photocurable composition of this embodiment is, for example, 0.01% by weight or more and 20% by weight or less, preferably 0.01% by weight or more and 5% by weight or less, more preferably 0.1% by weight or more and 5% by weight or less, and most preferably 0.5% by weight or more and 3% by weight or less. When the blend ratio is 0.01% by weight or more, it becomes easy to separate the mold. When the blend ratio is 20% by weight or less, appropriate surface tension and viscosity may be achieved.

Specific examples of the component (C) include nonionic surfactants represented by formula (3).

[Chem. 3]

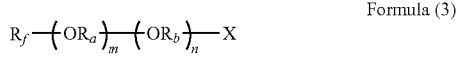

Formula (3)

In formula (3), Rf represents a group constituted by fluorine atoms and carbon atoms or a group constituted by fluorine atoms, carbon atoms, and hydrogen atoms, Ra represents an ethylene group, Rb represents a propylene group, and m and n each independently represent an integer of 0 or more and 100 or less. In the formula, m+n is 1 or more. However, when m or n is 2 or more and m+n is 3 or more, ORa and ORb may be random copolymerized or block copolymerized. X represents a hydroxyl group, a carboxyl group, a sulfo group, an alkoxy group, a pyridyl group, or a silanol group. The component (C) represented by formula (3) may be a compound represented by formula (4).

[Chem. 4]

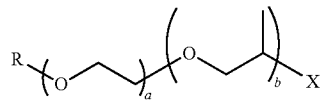

Formula (4)

In formula (4), R represents an alkyl group or an alkyl group with hydrogen substituted with fluorine, and X represents a hydroxyl group, a carboxyl group, a sulfo group, an alkoxy group, a pyridyl group, or a silanol group. In formula (4), a and b each represent an integer of 0 or more and at least one of a and b is 1 or more. In the case where a or b is 2 or more and a+b is 3 or more, the oxyethylene groups and the oxypropylene groups may be random copolymerized or block copolymerized.

In formula (4), R represents an alkyl group or an alkyl group with hydrogen substituted with fluorine. When R represents an alkyl group, the number of carbon atoms in the alkyl group may be 20 or less.

X represents a hydroxyl group, a carboxyl group, a sulfo group, an alkoxy group, a pyridyl group, or a silanol group. When the mold is composed of quartz, X preferably represents a hydroxyl group since a hydroxyl group readily adsorbs onto the quartz.

Moreover, a and b each represent an integer of 0 or more and at least one of a and b is 1 or more. The total of a and b is preferably 10 or more and more preferably 15 or more and a is preferably 9 or more. It should be noted that "a and b each represent an integer of 0 or more and at least one of a and b is 1 or more" naturally covers the cases in which a is 1 or more and b is 0, a and b are each 1 or more, and a is 0 and b is 1 or more.

Specific examples of the component (C) also include compounds represented by formulae (5) to (7) below:

[Chem. 5]

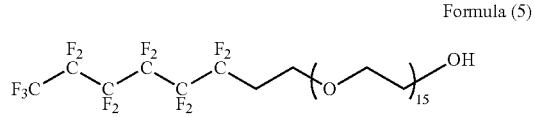

Formula (5)

[Chem. 6]

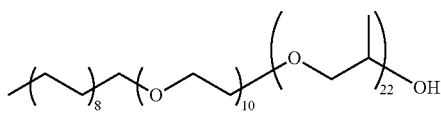

Formula (6)

Oxyethylene groups and oxypropylene groups in formula (6) may be random-copolymerized or block-copolymerized.

[Chem. 7]

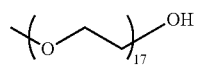
Formula (7)

The mold releasing agents represented by formulae (3) to (7) are particularly favored when the condensable gas is 1,1,1,3,3-pentafluoropropane ($CHF_2CH_2CF_3$, HFC-245fa, PFP).

(D): Other Components

As long as the effects of the invention are not impaired, the photocurable composition of this embodiment may contain additive components (D) suitable for various purposes in addition to the component (A) which is a polymerizable compound, the component (B) which is a photopolymerization initiator, and the component (C) which is a mold releasing agent. Examples of the additive components include a sensitizer, a hydrogen donor, an antioxidant, a solvent, and a polymer component.

A sensitizer is a compound that is added to accelerate polymerization reaction and improve reaction conversion rate. An example of the sensitizer is a sensitizing dye.

A sensitizing dye is a compound that is excited by absorption of light of a particular wavelength and interacts with the polymerization initiator, which is the component (B). The interaction refers to, for example, migration of energy or migration of electrons from a sensitizing dye in an excited state to a polymerization initiator serving as the component (B).

Specific examples of the sensitizing dye include anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, cyanine dyes, oxonol dyes, rhodamine dyes, and pyrylium salt dyes.

If the photocurable composition is to contain a sensitizer, only one sensitizer may be contained or two or more sensitizers may be contained.

A hydrogen donor is a compound that reacts with an initiator radical generated from the polymerization initiator serving as the component (B) and with a radical at the polymerization propagating terminal and thereby generates a radical having higher reactivity. A hydrogen donor may be added when the polymerization initiator serving as the component (B) is a photoradical generator.

Specific examples of the hydrogen donor include amine compounds such as N-butylamine, di-n-butylamine, tri-n-butylphosphine, allylthiourea, s-benzyl isothiuronium-p-toluene sulfinate, triethylamine, diethylaminoethyl methacrylate, triethylenetetramine, 4,4'-bis(dialkylamino) benzophenone, N,N-dimethylaminobenzoic acid ethyl ester, N,N-dimethylamino benzoic acid isoamyl ester, pentyl-4-dimethylamino benzoate, triethanolamine, and N-phenylglycine and mercapto compounds such as 2-mercapto-N-phenylbenzimidazole and mercapto propionic acid ester. The hydrogen donor is preferably 4,4'-bis(dialkylamino) benzophenone and more preferably 4,4'-bis(diethylamino) benzophenone among these compounds.

If a hydrogen donor is to be contained in the photocurable composition, only one hydrogen donor may be contained or two or more hydrogen donors may be contained.

In the case where the photocurable composition of this embodiment contains a sensitizer or a hydrogen donor as the additive component (D), the amount of the sensitizer or hydrogen donor relative to the total amount of the component (A) which is a polymerizable compound is preferably 0.1% by weight or more and 20% by weight or less, more preferably 0.1% by weight or more and 5.0% by weight or less, and most preferably 0.2% by weight or more and 2.0% by weight or less. A sensitizer can more effectively exhibit an effect of accelerating polymerization if it is contained in an amount of 0.1% by weight or more relative to the total amount of the component (A). At a sensitizer or hydrogen donor content of 20% by weight or less, the molecular weight of a polymer compound constituting a photocured product is sufficiently increased and dissolution failures and deterioration of storage stability can be suppressed.

Temperature at the Time of Blending Photocurable Composition

During preparation of the photocurable composition of this embodiment, at least the component (A), the component (B), and the component (C) are mixed and dissolved under a particular temperature condition. To be more specific, the temperature may be in the range of 0 degrees (Celsius) to 100 degrees (Celsius).

Viscosity of Photocurable Composition

The viscosity of the photocurable composition of this embodiment is preferably 1 cP or more and 100 cP or less, more preferably 5 cP or more and 50 cP or less, and most preferably 6 cP or more and 20 cP or less in terms of the viscosity of a mixture of components other than solvents at 23 degrees (Celsius).

When the viscosity of the photocurable composition is 100 cP or less, recesses of a fine pattern on a mold can be quickly filled with the photocurable composition during a mold contact step of bringing the photocurable composition into contact with the mold described below. Thus, pattern defects caused by filling failure are suppressed.

At a viscosity of 1 cP or more, the photocurable composition can be easily evenly applied onto a substrate in a placement step of placing the photocurable composition on a substrate described below. Thus, in the mold contact step of bringing the photocurable composition into contact with a mold, the composition does not easily flow out from edges of the mold.

Surface Tension of Photocurable Composition

The surface tension of the photocurable composition of this embodiment is preferably 5 mN/m or more and 70 mN/m or less, more preferably 7 mN/m or more and 35 mN/m or less, and most preferably 10 mN/m or more and 32 mN/m or less in terms of a surface tension of a mixture of components other than solvents at 23 degrees (Celsius).

At a surface tension of 5 mN/m or more, the photocurable composition can quickly fill recesses of a fine pattern on a mold in a mold contact step of bringing the photocurable composition into contact with the mold described below.

At a surface tension of 70 mN/m or less, the surface can be made flat and smooth.

Impurities in Photocurable Composition

A photocurable composition may be obtained through a purification step. The purification step may be filtration using a filter.

In conducting filtration with a filter, the component (A), the component (B), the component (C) and optional additive components may be mixed and then the resulting mixture may be filtered through a filter having a pore size of 0.001 micrometer or more and 5.0 micrometers or less. The filtration using a filter may be performed in two or more stages or may be repeated a number of times. The filtrate may be filtered again. Examples of the filter used in filtration include, but are not limited to, filters composed of polyethylene resin, polypropylene resin, fluorine resin, and nylon resin.

Impurities such as particles in the photocurable composition can be removed through such a purification step. As a result, unintended irregularities that are formed in a photocured product obtained by curing a photocurable composition containing impurities such as particles can be avoided and pattern defects can be reduced.

In the case where the photocurable composition of this embodiment is to be used in manufacturing a semiconductor integrated circuit, incorporation of metal atom-containing impurities (metal impurities) is to be avoided as much as possible in order not to inhibit operation of the product. In such a case, the concentration of the metal impurities in the photocurable composition is preferably 10 ppm or less and more preferably 100 ppb or less.

Next, a method for producing a patterned film according to an embodiment is described.

FIGS. 1A to 1G are each a schematic cross-sectional view illustrating a method for producing a patterned film according to one embodiment.

The method for producing a patterned film according to this embodiment includes the following steps:
(1) a step of placing the photocurable composition of the aforementioned embodiment on a substrate;
(2) a step of bringing the photocurable composition into contact with a mold in a condensable gas atmosphere;
(3) a step of irradiating the photocurable composition with light; and
(4) a step of releasing a cured product obtained in step (3) from the mold.

The method for producing a patterned film according to this embodiment is a process that utilizes a photo imprint method. However, the method for producing a patterned film according to the present invention is not limited to a photo imprint method. If the method for producing a patterned film according to the present invention is a process that utilizes a photo imprint method, a film having a nano-scale pattern shape can be produced.

The film obtained by the method for producing a patterned film according to this embodiment is preferably a film having a pattern 1 nm to 10 mm in size and more preferably a film having a pattern 10 nm to 100 micrometers in size.

These steps will now be described one by one.
Placement Step (1)

In this step (placement step), as shown in FIG. 1A, a photocurable composition 1 which is the same as the aforementioned photocurable composition is placed on a substrate 2 to form a coating film. Since the photocurable composition 1 is a liquid composition, this step may also be called a "coating step".

The substrate 2 onto which the photocurable composition 1 is placed may be adequately selected in accordance with the usage of a cured product 11 (photocured product) produced through the production method of this embodiment.

In particular, in the case where the cured product 11 is to be used as a mask for substrate processing, a semiconductor device substrate is used as the substrate 2 shown in FIG. 1A, for example. An example of the semiconductor device substrate is a substrate formed of a silicon wafer. A substrate composed of aluminum, a titanium-tungsten alloy, an aluminum-silicon alloy, an aluminum-copper-silicon alloy, silicon oxide, silicon nitride, or the like may be used instead of the substrate formed of a silicon wafer. The semiconductor device substrate may be a substrate composed of any of the aforementioned materials and surface-treated through a silane coupling treatment, a silazane treatment, or a film forming process using an organic material so that adhesion to the photocurable composition 1 is improved.

When an optically transparent substrate, in particular, a transparent substrate such as a glass substrate, is used as the substrate 2, a cured product pattern formed through the steps (1) to (4) can be used as an optical member or the like.

Examples of the method employed to place the photocurable composition 1 of this embodiment on the substrate 2 include an ink jet method, a dip coating method, an air knife coating method, a curtain coating method, a wire bar coating method, a gravure coating method, an extrusion coating method, a spin coating method, and a slit scanning method. The thickness of the shape transfer-receiving layer (coating film) changes according to the intended usage but is, for example, 0.01 micrometer or more and 100 micrometers or less.

In placing the photocurable composition 1 of this embodiment on the substrate 2, the form of placement may be, for example, (1-1) or (1-2) below. The form (1-1) is more preferable. This is because the thickness of the patterned cured film obtained later and the thickness of the residual film of the cured product pattern can be made even.

However, the method for producing a patterned film according to the present invention is not limited to these forms.

(1-1): The photocurable composition 1 is placed on plural portions of the substrate 2 while leaving spaces between the portions.
(1-2): the photocurable composition 1 is placed on all parts of the surface of the substrate 2.

When the form (1-1) is selected, the size of droplets of a coating film containing the photocurable composition 1 placed on (coating) the substrate 2 is on the micron order or submicron order. However, the present invention is not limited to this.

When the form (1-2) is selected, the thickness of a coating film containing the photocurable composition 1 placed on (coating) the substrate 2 changes according to the intended usage. For example, the thickness of the coating film can be adjusted so that the thickness after curing is 1 nm or more and 100 micrometers or less.

Step (2) of Bringing Photocurable Composition into Contact with Mold in Condensable Gas Atmosphere Next, the coating film composed of the photocurable composition 1 formed by the previous step (placement step) is brought into contact with a mold having an original pattern for pattern shape transfer in a condensable gas atmosphere.

This step includes steps (2-1) to (2-3) as illustrated in FIGS. 1B to 1C-2.
Condensable Gas Supplying Step (2-1)

In this step (condensable gas supplying step), as shown in FIG. 1B, a condensable gas 3 in a gas state is first supplied around the photocurable composition 1 on the substrate 2 at a pressure lower than the vapor pressure or at a temperature higher than the boiling point so that the atmosphere surrounding the photocurable composition 1 is a condensable gas atmosphere.

For the purposes of the present invention and the specification, a condensable gas refers to a gas that is normally in a gas state under temperature and pressure conditions inside the system for producing a photocured product having a desired pattern but becomes condensed (liquefies) under particular conditions in the contact step (embossing step) (2-2) described below.

The condensable gas has a boiling point of −10 degrees (Celsius) or higher and 23 degrees (Celsius) or lower or a room temperature vapor pressure of 0.1 MPa or higher and 0.4 MPa or lower. A condensable gas having a boiling point of 10 degrees (Celsius) or higher and 23 degrees (Celsius) or lower is particularly preferable.

A gas having a room temperature vapor pressure of 0.1 MPa or higher and 0.4 MPa or lower easily becomes condensed by capillary action that occurs as the photocurable composition 1 penetrates gaps between the substrate 2 and a mold 4 and recesses on the mold 4. As a result, the condensable gas liquefies and bubbles disappear.

Since the room temperature vapor pressure is 0.4 MPa or less, bubbles disappear easily and since the room temperature vapor pressure is 0.1 MPa or more, a complicated system is not needed.

Typically, the imprint region of a UV-curing type imprint system is used at room temperature. As long as the condensable gas has a boiling point lower than the temperature of the imprint region, the condensable gas remains in a gas state during imprint by controlling the temperature. Thus, a complicated system is not needed. For the purposes of the present invention and the specification. "room temperature" means a temperature in the range of 20 degrees (Celsius) to 25 degrees (Celsius).

Examples of the condensable gas include fluorocarbons, e.g., chlorofluorocarbon (CFC), fluorocarbon (FC), hydrochlorofluorocarbon (HCFC), hydrofluorocarbon (HFC), and hydrofluoroether (HFE).

Among fluorocarbons, 1,1,1,3,3-pentafluoropropane is preferable. 1,1,1,3,3-Pentafluoropropane has a vapor pressure of 0.14 MPa at 23 degrees (Celsius) near room temperature and a boiling point of 15 degrees (Celsius).

These condensable gases may be used alone or as a mixture of two or more. The condensable gas may be mixed with a non-condensable gas such as air, nitrogen, carbon dioxide, helium, or argon and a mixed gas may be used. Accordingly, the condensable gas atmosphere may be a mixed gas atmosphere containing a condensable gas and a non-condensable gas. Helium may be used as the non-condensable gas. Accordingly, a mixed gas may contain 1,1,1,3,3-pentafluoropropane and helium. For example, a mixed gas containing 1,1,1,3,3-pentafluoropropane and helium at a flow rate of 2 to 3 relative to a flow rate of 1 of 1,1,1,3,3-pentafluoropropane may be used.

Contact Step (2-2)

Next, the photocurable composition 1 (shape transfer-receiving layer) is brought into contact with the mold 4 (FIG. 1C-1). This step is also called an embossing step. In the previous step (condensable gas supplying step), the atmosphere surrounding the photocurable composition 1 is the condensable gas 3; thus, this step (contact step) is also performed in the condensable gas 3 atmosphere.

As shown in FIG. 1C-1, when the mold 4 is brought into contact with the photocurable composition 1, the photocurable composition 1 penetrates the gaps between the substrate 2 and the mold 4 and the recesses of a fine pattern on the surface of the mold 4 by capillary action.

During this process, the condensable gas 3 present in the gaps between the substrate 2 and the mold 4 and recesses on the mold 4 becomes condensed and liquefies under a pressure condition generated by penetration of the photocurable composition 1 (capillary action condition generated by penetration of the photocurable composition 1) or, to be more precise, under a pressure condition and other conditions (such as temperature conditions). A gas that becomes condensed under the above-described conditions is referred to as a condensable gas in this embodiment and the present invention.

The volume of the condensable gas 3 present in the gaps between the substrate 2 and the mold 4 and the recesses on the mold 4 decreases to several hundredth as the condensable gas 3 liquefies. Since the volume of the liquefied condensable gas 3 is very small and close to zero, bubbles rarely form in a fine pattern 10 of the coating film composed of the photocurable composition 1. Thus, the pattern transfer accuracy is improved.

FIGS. 2A and 2B are plan views showing the state of photocurable composition 1 placed in plural portions spaced from one another in the step (1) (the form (1-1)).

FIG. 2A shows the state of the photocurable composition 1 in the placement step (1) and FIG. 2B shows the state of the photocurable composition 1 in the contact step (2).

As shown in FIG. 2A, three droplets of the photocurable composition 1 spaced from one another are placed. When the droplets are brought into contact with a mold (not shown in the drawing), the droplets of the photocurable composition 1 move and diffuse. At this stage, two droplets that have diffused and formed a thin film contact each other at a site 1a and the three droplets that have been diffused and formed a thin film contact one another at a site 1b. The condensable gas that is present at the site 1a and the site 1b receives pressure from the droplets of the photocurable composition 1, becomes condensed, and liquefies. Accordingly, bubbles rarely occur at the site 1a and the site 1b.

The mold 4 used in this step needs to be composed of a light-transmitting material in view of the subsequent step (irradiation step).

Examples of the material constituting the mold 4 include glass, quartz, PMMA, light-transmitting resin such as polycarbonate resin, transparent metal vapor deposited films, flexible films such as polydimethylsiloxane, photocured films, and metal films. However, when a light-transmitting resin is used as the material constituting the mold 4, a resin that does not dissolve in the solvent contained in the photocurable composition 1 needs to be selected.

The mold 4 may be subjected to a surface treatment prior to this contact step of bringing the photocurable composition into contact with the mold in order to improve the releasing property between the cured product and the surface of the mold 4. An example of the surface treatment is a method of preliminarily forming a releasing layer on the mold surface by applying a mold releasing agent to the surface of the mold. Examples of the mold releasing agent applied to the surface of the mold include silicon releasing agents, fluorine releasing agents, polyethylene releasing agents, polypropylene releasing agents, paraffin releasing agents, montan releasing agents, and carnauba releasing agents. For example, a commercially available application-type mold releasing agent such as OPTOOL DSX produced by Daikin Industries Ltd., is suitable for use. These releasing agents may be used alone or in combination. Among these, fluorine releasing agents are particularly preferable.

The pressure applied in bringing the photocurable composition 1 into contact with the mold 4 is not particularly limited. The contact time is also not particularly limited. However, if the contact time is excessively short, the photocurable composition 1 may not sufficiently penetrate the gaps between the substrate 2 and the mold 4 and the recesses (fine pattern) on the mold 4. If the contact time is excessively long, the productivity is degraded.

Irradiation Step (3)

Next, as shown in FIG. 1D, the portion of the photocurable composition 1 in contact with the mold, namely, the fine pattern 10 that includes the photocurable composition 1 filling the fine pattern of the mold (FIG. 1C-2), is irradiated with light through the mold 4. As a result, the fine pattern 10 of the coating film filling the fine pattern of the mold is cured by light (light 5) and forms a cured product 11.

The light applied to the photocurable composition 1 constituting the fine pattern 10 of the coating film filling the fine pattern of the mold is selected in accordance to the sensitive wavelength of the photocurable composition 1. In particular, ultraviolet rays having a wavelength of 150 nm or more and 400 nm or less, x-rays, electron beams, and the like may be used.

The light (light 5) applied to the fine pattern 10 of the coating film may be ultraviolet light. This is because many commercially available curing aids (photopolymerization initiators) are compounds sensitive to ultraviolet light. Examples of the light source of ultraviolet light include a high pressure mercury lamp, an ultra high pressure mercury lamp, a low pressure mercury lamp, a deep-UV lamp, a carbon arc lamp, a chemical lamp, a metal halide lamp, a xenon lamp, a KrF excimer laser, an ArF excimer laser, and a $F_2$ excimer laser. Among these, an ultra high pressure mercury lamp is particularly preferable. The number of the light sources to be used may be one or more. Irradiation may be performed on all or some parts of the coating film 4 filling the fine pattern of the mold.

Irradiation may be performed intermittently two or more times or continuously on all parts. Alternatively, a region A may be irradiated in a first irradiation process and then a region B different from the region A may be irradiated in a second irradiation process.

When the photocurable composition 1 is thermally curable, thermal curing may be performed at the same time with or after the irradiation and before the mold releasing step. The heating atmosphere, heating temperature, and the like during the thermal curing are not particularly limited. For example, heating may be performed in an inert atmosphere or at reduced pressure at 40 degrees (Celsius) or higher and 200 degrees (Celsius) or lower. A hot plate, an oven, a furnace, or the like can be used for heating.

Mold Releasing Step (4)

Next, the cured product 11 is separated from the mold 4 so as to form a cured film 12 having a particular pattern shape on the substrate 2.

In this step (mold releasing step), as shown in FIG. 1E, the cured product 1 is separated from the mold 4. The pattern of the resulting patterned cured film 12 is the inverted pattern of the fine pattern formed on the surface of the mold 4 in the step (3) (irradiation step).

The cured product 11 may be separated from the mold 4 by any method as long as the cured product 11 is not partly physically damaged by the separation and conditions therefor are not particularly limited. For example, the substrate 2 (processing substrate) may be fixed and the mold 4 may be moved away from the substrate 2 so as to perform separation. Alternatively, the mold 4 may be fixed and the substrate 2 may be moved away from the mold 4 to perform separation. Both the mold 4 and the substrate 2 may be moved in opposite directions to perform separation.

As a result of conducting a production process including the aforementioned steps (1) to (4), a cured film 12 having a desired recess-projection pattern shape (the pattern shape derived from the recess-projection shape of the mold 4) can be obtained. The pattern pitch of the recess-projection pattern of the cured film 12 is determined by the pattern pitch of the recess-projection pattern on the surface of the mold 4.

The pattern pitch of the recess-projection pattern on the surface of the mold 4 can be freely set. To be more specific, the pattern pitch may be on the order of millimeters, micrometers (including sub-micrometers), and nanometers. In the case where a nanometer-order recess-projection pattern is to be formed by the production method of the present invention, a pattern having a pattern pitch of 20 nm or less can be formed.

If the mold 4 has a smaller area than the substrate 2, some part of the photocurable composition 1 on the substrate 2 is not in contact with the mold 4. In such a case, the mold 4 is moved as needed after use so that the production process including the steps (1) to (4) is performed on two or more regions on the substrate 2. As a result, two or more cured films 12 each having a pattern shape derived from the recess-projection shape of the mold 4 can be formed on the substrate 2.

The resulting patterned cured film 12 can be used as an optical member (including the cases in which the cured film 12 is used as a part of the optical member) such as a Fresnel lens or a diffraction lattice. In such a case, the optical member includes at least a substrate 2 and a patterned cured film 12 disposed on the substrate 2.

Etching Step (5)

The cured film obtained by the mold releasing step (4) has a particular pattern shape. However, some part of the film sometimes remains on the regions other than the regions where the pattern shape is formed (hereinafter, such part of the film may be referred to as the residual film). In such a case, as shown in FIG. 1F, the part of the cured film (residual film) on the regions to be removed is removed from the patterned cured film so that a cured pattern 13 having a desired recess-projection pattern shape (pattern shape derived from the recess-projection pattern of the mold 4) can be obtained.

The residual film may be removed by etching the recessed portion of the patterned cured film 12 so as to expose the surface of the substrate 2 in the recesses of the pattern of the patterned cured film 12.

The specific method for etching away the film at the recesses of the pattern of the patterned cured film 12 is not particularly limited. A known method such as dry etching may be employed. A known dry etching apparatus can be used for dry etching. The source gas for dry etching is appropriately selected in accordance to the elemental composition of the cured film to be etched. Examples of the source gas that can be used include halogen gases such as $CF_4$, $C_2F_6$, $C_3F_8$, $CCl_2F_2$, $CCl_4$, $CBrF_3$, $BCl_3$, $PCl_3$, $SF_6$, and $Cl_2$, oxygen-containing gases such as $O_2$, CO, and $CO_2$, inert gases such as He, $N_2$, and Ar, and other gases such as $H_2$ and $NH_3$. These gases may be used in combination as a mixture.

A cured pattern 13 having a desired recess-projection pattern shape (pattern shape derived from the recess-projection shape of the mold 4) can be obtained by the production process including the steps (1) to (5) described above. An article having the cured pattern can also be obtained. In the case where the substrate 2 is to be further worked by using the cured pattern 13, a substrate working step (step (6)) described below is performed.

The cured pattern 13 can be used as an optical member (including the cases where the cured pattern 13 is used as a part of the optical member) such as a diffraction pattern or a polarizing plate so as to obtain an optical component. In such a case, the optical component includes at least a substrate 2 and a cured pattern 13 disposed on the substrate 2.

Substrate Working Step (6)

The cured pattern 13 having a recess-projection pattern shape obtained by the method for producing a patterned film according to this embodiment can be used in, for example, an interlayer insulating film of an electronic component such as a semiconductor device, ex., LSI, a system LSI, DRAM, SDRAM, RDRAM, or D-RDRAM. The cured pattern 13 can also be used as a resist film for semiconductor device production.

In the case where the cured pattern 13 is used as a resist film, the portions of the substrates in which the surface has been exposed by the etching step (5) are etched or ion-implanted. During this process, the cured pattern 13 functions as a mask. As a result, a circuit structure 20 (FIG. 1G) derived from the pattern shape of the cured pattern 13 can be formed on the substrate 2. As a result, a circuit board used in a semiconductor device or the like can be produced. An electronic component (electronic device) can be formed by forming an electronic members on the circuit board. A controlling mechanism for controlling the circuit board may be provided to the circuit board so as to form an electronic component such as a display, a camera, or medical equipment. Similarly, the cured pattern 13 may be used as a resist film and an optical component may be obtained by performing etching or ion implantation.

In producing a circuit-loaded substrate or an electronic component, the cured pattern 13 may eventually be removed from the worked substrate. Alternatively, the cured pattern 13 may be left as a part of the device.

EXAMPLES

The present invention will now be described in further detail through Examples below. The technical scope of the present invention is not limited by the examples described below. The "parts" and "%" are on a weight basis unless otherwise noted.

Measurement of Saturated Solubility of Mold Releasing Agent (Component (C)) in Condensable Gas The saturated solubility of mold releasing agents represented by formulae (5) to (8) below serving as the component (C) in a condensable gas, namely, 1,1,1,3,3-pentafluoropropane ($CHF_2CH_2CF_3$, HFC-245fa, PFP), which is liquid at 5 degrees (Celsius) and 1 atm. was measured at 5 degrees (Celsius).

(C-1) Megaface EXP. TF-2067 (Produced by DIC Corporation, Nonionic Fluorine Surfactant)

[Chem. 8]

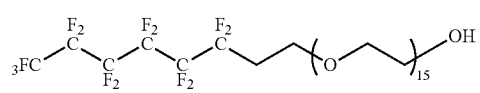

Formula (5)

Into a sample jar, 1.00 g of Megaface EXP. TF-2067 was weighed and 0.48 g of PFP in a liquid state at 5 degrees (Celsius) and 1 atm was added thereto. Megaface EXP. TF-2067 did not dissolve. PFP was further added so that the total amount of PFP was 0.62 g. Then, Megaface EXP. TF-2067 dissolved completely. The saturated solubility of Megaface EXP. TF-2067 (component (C)) in PFP was thus 62% by weight or more and less than 68% by weight.

(C-2) BLAUNON SA-30/70 2000R (Produced by Aoki Oil Industrial Co., Ltd., Nonionic Alkyl Surfactant, Molecular Weight: 2000)

[Chem. 9]

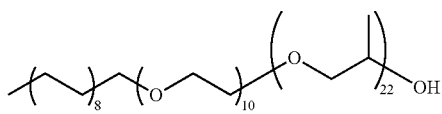

Formula (6)

Into a sample jar, 1.70 g of BLAUNON SA-30/70 2000R was weighed and 0.15 g of PFP in a liquid state at 5 degrees (Celsius) and 1 atm was added thereto. BLAUNON SA-30/70 2000R did not dissolve. PFP was further added so that the total amount of PFP was 0.30 g. Then, BLAUNON SA-30/70 2000R dissolved completely. The saturated solubility of BLAUNON SA-30/70 2000R (component (C)) in PFP was thus 85% by weight or more and less than 92% by weight.

(C-3) Pluriol A760E (Produced by BASF, Methyl Polyethylene Glycol)

[Chem. 10]

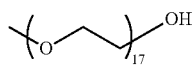

Formula (7)

Into a sample jar, 1.55 g of Pluriol A760E was weighed and 1.44 g of PFP in a liquid state at 5 degrees (Celsius) and 1 atm was added thereto. Pluriol A760E did not dissolve. PFP was further added so that the total amount of PFP was 1.58 g. Then, Pluriol A760E dissolved completely. The saturated solubility of Pluriol A760E (component (C)) in PFP was thus 50% by weight or more and less than 52% by weight.

(C-4) BLAUNON SR-705 (Produced by Aoki Oil Industrial Co., Ltd., Nonionic Alkyl Surfactant)

[Chem. 11]

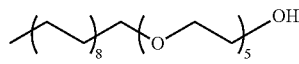

Formula (8)

Into a sample jar, 0.10 g of BLAUNON SR-705 was weighed and 10.0 g of PFP in a liquid state at 5 degrees (Celsius) and 1 atm was added thereto. BLAUNON SR-705 did not dissolve. The saturated solubility of BLAUNON SR-705 (component (C)) in PFP was thus less than 0.1% by weigh.

Measurement of Saturated Solubility of Condensable Gas in (Meth)Acrylate Monomer (Component A)

The condensable gas was 1,1,1,3,3-pentafluoropropane ($CHF_2CH_2CF_3$, HFC-245fa, PFP). The room-temperature (23 degrees (Celsius)) saturated solubility of PFP in a (meth)acrylate monomer (component (A)), which was a mixed solution containing 75 parts by weight of isobornyl acrylate (produced by Kyoeisha Chemical Co., Ltd., trade name: IB-XA) and 25 parts by weight of 1,10-decanediol diacrylate (produced by Shin-Nakamura Chemical Co., Ltd., trade name: A-DOD-N), was measured.

Three grams of the (meth)acrylate monomer (component (A)) was weighed and PFP was bubbled into the (meth)acrylate monomer at a flow rate of 0.1 L/min for 15 minutes at 23 degrees (Celsius) and 1 atm. The total weight measured was 3.87 g. Thus, the saturated solubility of PFP in the (meth)acrylate monomer (component (A)) was 29% by weight.

Example 1

Preparation of Photocurable Composition 1

A (meth)acrylate monomer (component (A)), a photopolymerization initiator (component (B)), and a mold releasing agent (component (C)) described below were mixed to obtain a mixed solution.

Component (A) (Total: 100 Parts by Weight)

(A-1) Isobornyl acrylate (produced by Kyoeisha Chemical Co., Ltd., trade name: IB-XA): 75 parts by weight (A-2) 1,10-Decanediol diacrylate (produced by Shin-Nakamura Chemical Co., Ltd., trade name: A-DOD-N): 25 parts by weight Component (B)

(B-1) IRGACURE 369 (Produced by BASF): 3 Parts by Weight

Note that (B-1) IRGACURE 369 is a compound represented by formula (1) below which is (2-benzyl-2-dimethylamino-1-(4-morpholinophenyl)-butanone-1).

[Chem. 12]

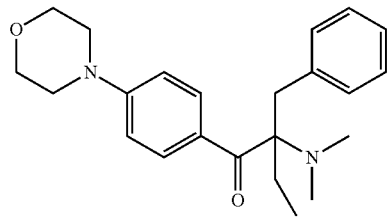

Formula (1)

Component (C)

(C-1) Megaface EXP. TF-2067 (Produced by DIC Corporation, Nonionic Fluorine Surfactant): 1.1 Parts by Weight Next, the resulting mixed solution was filtered through an ultra high-molecular-weight polyethylene filter with 5 nm pore size. As a result, a photocurable composition 1 of this example (Example 1) was obtained.

(Measurement of Mold Releasing Force)

The mold releasing force in a mixed atmosphere containing 92% PFP as a condensable gas and 8% air was measured by using the photocurable composition 1 according to the production process illustrated in FIGS. 1A to 1G. In measuring the mold releasing force, NIM-80L RESO (produced by NTT-AT) was used as the mold 4, light was applied from an UV light source SP-7 (produced by Ushio Inc.) at 50 mW/cm² for 10 seconds, and a load cell TU-PAR (produced by TEAC) was used.

In actual measurement, the mold releasing force was measured nine times under the same conditions and the average was calculated from the measurement data. The result of the measurement showed that the average mold releasing force was 17 N. This value was lower than when photocurable compositions of Comparative Examples described below were used.

Example 2

Preparation of Photocurable Composition 2

A photocurable composition 2 was prepared as in Example 1 except that 2.0 parts by weight of (C-2) BLAUNON SA-30/702000R (produced by Aoki Oil Industrial Co., Ltd., nonionic alkyl surfactant) was used as the mold releasing agent (component (C)).

(Measurement of Mold Releasing Force)

The average mold releasing force was measured as in Example 1 but by using the photocurable composition 2. The average mold releasing force was 13 N. This value was lower than when photocurable compositions of Comparative Examples described below were used.

Example 3

Preparation of Photocurable Composition 3

A photocurable composition 3 was prepared as in Example 1 except that 0.8 part by weight of (C-3) Pluriol A760E (produced by BASF, methyl polyethylene glycol) was used as the mold releasing agent (component (C)).

(Measurement of Mold Releasing Force)

The average mold releasing force was measured as in Example 1 but by using the photocurable composition 3. The average mold releasing force was 17 N. This value was lower than when photocurable compositions of Comparative Examples described below were used.

Comparative Example 1

Preparation of Photocurable Composition 4

A photocurable composition 4 was prepared as in Example 1 except that 0.5 part by weight of (C-4) BLAUNON SR-705 (produced by Aoki Oil Industrial Co., Ltd., nonionic alkyl surfactant) was used as the mold releasing agent (component (C)).

(Measurement of Mold Releasing Force)

The average mold releasing force was measured as in Example 1 but by using the photocurable composition 4. The average mold releasing force was 25 N.

Comparative Example 2

Preparation of Photocurable Composition 5

A photocurable composition 5 was prepared as in Example 1 except that no mold releasing agent (component (C)) was added.

(Measurement of Mold Releasing Force)

The average mold releasing force was measured as in Example 1 but by using the photocurable composition 5. The average mold releasing force was 38 N.

Example 4

Preparation of Photocurable Composition 6

A (meth)acrylate monomer (component (A)), a photopolymerization initiator (component (B)), a mold releasing agent (component (C)), and other components (D) described below were mixed to obtain a mixed solution.

Component (A) (Total: 100 Parts by Weight)
(A-1) Isobornyl acrylate (Kyoeisha Chemical Co., Ltd., trade name: IB-XA): 75 parts by weight
(A-2) 1,10-Decanediol diacrylate (Shin-Nakamura Chemical Co., Ltd., trade name: A-DOD-N): 25 parts by weight Component (B)
(B-1) Lucirin TPO (produced by BASF): 3 parts by weight
Note that (B-1) Lucirin TPO is a compound represented by formula (2).

[Chem. 13]

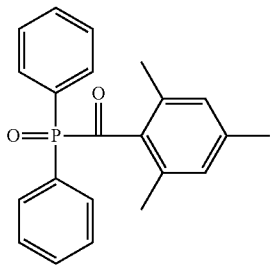

Formula (2)

Component (C)
(C-1) Megaface EXP. TF-2067 (produced by DIC Corporation, nonionic fluorine surfactant): 1.1 parts by weight Component (D)
(D-1) 4,4-Bis(diethylamino)benzophenone: 0.5 part by weight
Note that (D-1) 4,4-bis(diethylamino)benzophenone is a compound represented by formula (9).

[Chem. 14]

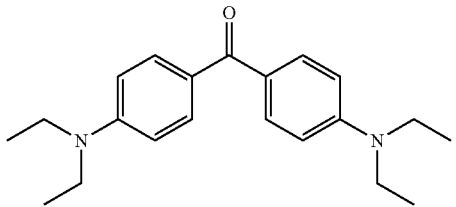

Formula (9)

Next, the mixed solution obtained was filtered through an ultra high-molecular-weight polyethylene filter with 5 nm pore size. As a result, a photocurable composition 6 of this example (Example 4) was obtained.

(Measurement of Mold Releasing Force)
The mold releasing force was measured by the method described below using the photocurable composition 6.

(1) Placement Step
A total of 1440 droplets (11 pL each) of the photocurable composition 6 were discharged by an inkjet method onto a 300 mm silicon wafer on which an adhesion promoting layer 3 nm in thickness was formed as an adhesive layer. The droplets were discharged in a region 26 mm in length and 33 mm in width in such a manner that the pitches between the droplets were substantially even.

(2) Mold Contact Step and Irradiation Step
The ratio of the flow rate of PFP to the flow rate of He was adjusted to 1:2 so that the atmosphere was constituted by a mixed gas of PFP and He.

A quartz mold (26 mm in length and 33 mm in width) having a 28 nm line-and-space (L/S) pattern and not being subjected to a surface treatment was brought into contact with the photocurable composition 6 on the silicon wafer.

Thirty seconds after the quartz mold was brought into contact with the photocurable composition 6, the photocurable composition was irradiated with UV light through the quartz mold by using a UV light source (EXECURE 3000 produced by HOYA CANDEO OPTRONICS CORPORATION) equipped with a 200 W mercury xenon lamp. In irradiating the photocurable composition 6 with UV light, an interference filter (VPF-50C-10-25-31300, produced by Sigma Koki Co., Ltd.) that selectively passes light of 313 plus/minus 5 nm wavelength was placed between the UV light source and the quartz mold. The illuminance of the UV light was 60 mW/cm$^2$ directly under the quartz mold at a wavelength of 313 nm. The UV irradiation was conducted for 90 seconds (exposure: 5.4 J/cm$^2$) under the above-described conditions.

(3) Mold Releasing Step
Next, the quartz mold was pulled up at 0.5 mm/s to separate the mold from the photocured film and the mold releasing force required thereat was measured. The mold releasing force was 52 N.

Example 5

Preparation of Photocurable Composition 7

A photocurable composition 7 was prepared as in Example 4 except that 2.0 parts by weight of (C-2) BLAUNON SA-30/70 2000R (produced by Aoki Oil Industrial Co., Ltd., nonionic alkyl surfactant) was used as the mold releasing agent (component (C)).

(Measurement of Mold Releasing Force)
The mold releasing force was measured as in Example 4 but by using the photocurable composition 7. The mold releasing force was 54 N.

Example 6

Preparation of Photocurable Composition 8

A photocurable composition 8 was prepared as in Example 4 except that 0.8 part by weight of (C-3) Pluriol A760E (produced by BASF, methyl polyethylene glycol) was used as the mold releasing agent (component (C)).

(Measurement of Mold Releasing Force)
The mold releasing force was measured as in Example 4 except that the photocurable composition 8 was used. The mold releasing force was 51 N.

Comparative Example 3

Preparation of Photocurable Composition 9

A photocurable composition 9 was prepared as in Example 4 except that 0.5 part by weight of (C-4) BLAUNON SR-705 (produced by Aoki Oil Industrial Co., Ltd., nonionic alkyl surfactant) was used as the mold releasing agent (component (C)).

(Measurement of Mold Releasing Force)

The mold releasing force was measured as in Example 4 except that the photocurable composition 9 was used. The mold releasing force was 58 N.

The mold releasing force was measured as in Examples 5 and 6 and Comparative Example 3 except that the PFP-to-He flow rate ratio was 1:3. Similar results were obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-133538, filed Jun. 26, 2013, No. 2013-247135, filed Nov. 29, 2013 and No. 2014-109339, filed May 27, 2014 which are hereby incorporated by reference herein in their entirety.

The invention claimed is:

1. A method for producing a patterned film, the method comprising:
    a step of placing a photocurable composition on a substrate;
    a step of bringing the photocurable composition into contact with a mold in an atmosphere containing a condensable gas, the mold having an original pattern for transferring a pattern shape;
    a step of irradiating the photocurable composition with light to form a cured film; and
    a step of separating the cured film from the mold,
    wherein the photocurable composition comprises:
        a component (A) which is a (meth)acrylate monomer;
        a component (B) which is a photopolymerization initiator; and
        a component (C) which is a mold releasing agent,
        wherein a saturated solubility of the component (C) in the condensable gas at 5 degrees (Celsius) and 1 atm is 50% by weight or more, the condensable gas being in a liquid state at 5 degrees (Celsius) and 1 atm, and
        the condensable gas is a gas that becomes condensed and liquefies by a pressure of capillary action applied to the condensable gas by the photocurable composition during the step of bringing the photocurable composition into contact with the mold.

2. The method according to claim 1, wherein the atmosphere is a mixed gas atmosphere containing the condensable gas and a non-condensable gas.

3. The method according to claim 2, wherein the non-condensable gas is helium.

4. The method according to claim 1, wherein the condensable gas is one selected from chlorofluorocarbon, fluorocarbon, hydrochlorofluorocarbon, hydrofluorocarbon, and hydrofluoroether.

5. The method according to claim 1, wherein the condensable gas is 1,1,1,3,3-pentafluoropropane.

6. A method for producing an optical component, the method comprising a step of obtaining a patterned film on a substrate by the method according to claim 1.

* * * * *